United States Patent
Ko et al.

(10) Patent No.: US 7,088,637 B2
(45) Date of Patent: Aug. 8, 2006

(54) SEMICONDUCTOR MEMORY DEVICE FOR HIGH SPEED DATA ACCESS

(75) Inventors: Jae-Bum Ko, Ichon-shi (KR); Jin-Hong Ahn, Ichon-shi (KR); Sang-Hoon Hong, Ichon-shi (KR); Se-Jun Kim, Ichon-shi (KR)

(73) Assignee: Hynix Semiconductor, Inc. (KR)

( * ) Notice: Subject to any disclaimer, the term of this patent is extended or adjusted under 35 U.S.C. 154(b) by 37 days.

(21) Appl. No.: 10/876,380

(22) Filed: Jun. 25, 2004

(65) Prior Publication Data

US 2005/0141324 A1  Jun. 30, 2005

(30) Foreign Application Priority Data

Dec. 29, 2003  (KR)  .................... 10-2003-0098456

(51) Int. Cl.
  *G11C 8/00*  (2006.01)
  *G11C 11/34* (2006.01)
  *G11C 7/00*  (2006.01)

(52) U.S. Cl. .................... 365/230.03; 365/185.21; 365/205; 365/222

(58) Field of Classification Search .......... 365/230.03, 365/205, 222, 185.21
See application file for complete search history.

(56) References Cited

U.S. PATENT DOCUMENTS

| 6,275,407 | B1* | 8/2001 | Otsuka ................. 365/63 |
| 6,426,905 | B1* | 7/2002 | Dennard et al. .......... 365/204 |
| 6,611,446 | B1* | 8/2003 | Kawasumi ............... 365/63 |
| 6,665,203 | B1* | 12/2003 | Fujisawa et al. ........ 365/51 |
| 6,937,535 | B1* | 8/2005 | Ahn et al. ............. 365/222 |
| 2004/0085835 | A1* | 5/2004 | Ahn et al. ............. 365/200 |
| 2004/0240291 | A1* | 12/2004 | Kang .................. 365/205 |

* cited by examiner

*Primary Examiner*—Amir Zarabian
*Assistant Examiner*—Anthan Tran
(74) *Attorney, Agent, or Firm*—Blakely Sokoloff Taylor & Zafman

(57) ABSTRACT

A semiconductor memory device having a high speed for a data transmission includes a plurality of cell blocks, each having a plurality of unit cells for storing data; a plurality of local bit line sense amplifying block, each for sensing and amplifying the data stored in the N number of cell blocks; a global bit line sense amplifying block for latching the data amplified by the local bit line sense amplifying blocks; and a data transferring block for transmitting the data from the local bit line sense amplifying block to the global bit line sense amplifying block.

6 Claims, 7 Drawing Sheets

SEMICONDUCTOR MEMORY DEVICE FOR HIGH SPEED DATA ACCESS

FIELD OF THE INVENTION

The present invention relates to a semiconductor memory device; and, more particularly, to the semiconductor memory device capable of providing a reduced data access time.

DESCRIPTION OF RELATED ART

Generally, a semiconductor memory device is classified as a random access memory (RAM) and a read only memory (ROM).

The RAM includes a Dynamic RAM (DRAM) and a Static RAM (SRAM). One cell of the dynamic RAM has one transistor and one capacitor and that of the static RAM does four transistors and two load resistances. The DRAM is used more widespread than the SRAM because the DRAM is more efficient than SRAM in a chip integration and a manufacturing process.

Today, an operation speed of a central processing unit (CPU) is more dramatically advanced than that of the DRAM. As a result, many problems may arise because the operation speed of the memory device is slower than that of CPU. For overcoming these problems, several kinds of scheme in the memory device have been developed for a high speed data transmission.

On the other hand, for improving to increase an operation speed of the conventional semiconductor memory device, the semiconductor memory device operates in synchronization with an external clock signal. Thus, a synchronous semiconductor memory device SDRAM, which operates in synchronization with the external clock signal, has been developed.

The SDRAM, which performs a data access operation once within one cycle of the external clock signal, is particularly called a single data rate SDRAM (SDR SDRAM).

However, the SDR SDRAM had to be more improved for use in a high speed system. It is because a double data rate SDRAM (DDR SDRAM) has been developed. The DDR SDRAM carries out the data access operation at a rising edge and a falling edge of the external clock signal. That is, the DDR SDRAM performs the data access operation twice within one cycle of the external clock signal.

Since the DDR SDRAM should perform the data access operation twice within one cycle of the external clock signal, a data access method used in the SDR SDRAM cannot be used in the DDR SDRAM.

If a cycle of the external clock signal is 10 nsec, the DDR SDRAM has only under about 6 nsec, except for a operation margin including rising and falling edges of the external clock (about 0.5 nsec×4=2), for performing the data access operation. The 6 nsec is too short time for the DDR SDRAM to handle and access two consecutive data.

FIG. 1 is a block diagram showing a conventional semiconductor memory device.

As shown, the conventional semiconductor memory device includes a plurality of banks 10 to 40, a plurality of I/O sense amplifying blocks 10a to 40a and a data output buffer 50.

Each bank includes a plurality of cell blocks 12_1 to 12_n and a plurality of bit line sense amplifying blocks 14_1 to 14_n+1. Herein, n is positive integer. Each cell block has a plurality of unit cells for storing data. Each bit line sense amplifying block is for sensing data stored in the cell block and amplifying the sensed data to thereby output the amplified data to each I/O sense amplifying block. Herein, each bank, e.g., 10, is coupled to each corresponding I/O sense amplifying block, e.g., 10_a.

Then, the data inputted from each bank is amplified by each I/O sense amplifying block and outputted to the data output buffer 50.

FIG. 2 is a block diagram of the bank, e.g., 10, shown in FIG. 1.

As shown, the bank 10 includes a plurality of cell blocks, e.g., 12_1 to 12_3, each having a plurality of unit cells. Herein, each unit cell has a typical constitution of one capacitor and one transistor. Throughout a pair of bit lines BL and /BL, each cell blocks is coupled to each bit line sense amplifying block, e.g., 14_2, which is for sensing and amplifying the data supplied to the bit line pair BL and /BL. Also, first and second sense amplifier controllers 200 and 300 respectively output a first control signal, e.g., BISH1, and a second control signal, e.g., BISL1, for connecting or disconnecting each of first and second bit line sense amplifying blocks 14_2 and 14_3 to each cell blocks 12_1 to 12_3.

Herein, for increasing an integration of chip, each cell block, e.g., 12_2, is coupled to two neighboring bit line sense amplifying blocks, e.g., 14_2 and 14_3. Also, each bit line sense amplifying block, e.g., 14_2, is coupled to two neighboring cell blocks, e.g., 12_1 and 12_2. As a result, if there are N number of banks in one bank, N+1 number of bit line sense amplifying blocks are necessary. Herein, N is positive integer. That is, if data stored in the first cell block 12_1 should be accessed, in former times, the sense amplifying block senses and amplifies data if data of a cell of the cell array individually having a sense-amp supplied to the bit line. However, in the present time, two cell arrays 12_1 and 12_2 are coupled to the second bit line sense amplifying block 14_2 for the high implementation of the memory device; and the second bit line sense amplifying block 14_2 is connected or disconnected to the first and second cell blocks 12_1 and 12_2 by the first and second control signals BISH1 and BISL1.

Hereinafter, referring to FIGS. 1 and 2, operation of the conventional semiconductor memory device is described in detail.

First of all, for data access, an address is inputted to the conventional semiconductor memory device; and the inputted address is decoded. Based on the decoded address, the cell block is selected. For instance, if the second cell block 12_2 is selected, the second and third bit line sense amplifying blocks 14_2 and 14_3 are connected to the second cell block 12_2.

Then, in response to the inputted address, data stored in the second cell block 12_2 are sensed and amplified by the second and third bit line sense amplifying blocks 14_2 and 14_3; and the amplified data are outputted to the I/O sense amplifying block 10a.

Herein, data stored in each cell block are outputted in response to one activated word line corresponding to the decoded address. If the number of unit cells in response to one word line is 1024, the second and third bit line sense amplifying blocks, e.g., 14_2 and 14_3, respectively amplify a half of the data, i.e., 512 data. Namely, each bit line sense amplifying block has 512 sense amplifiers.

Thereafter, a predetermined number of data among the amplified data is outputted to the I/O sense amplifying block 10a. At this time, the number of data outputted at once from the each bit line sense amplifying block is based on a capability of the semiconductor memory device, i.e., how many data the semiconductor memory device outputs at once. For example, if the semiconductor memory device has an X16 mode, 16 data are outputted at once from the bit line sense amplifying block to the I/O sense amplifying block.

The I/O sense amplifying block, e.g., 10a, delivers the data inputted from the bit line sense amplifying block to the data output buffer 50. The data output buffer 50 outputs the data to an external part at proper timing.

As above described, for increasing an operation speed of the semiconductor memory device, the semiconductor memory device performs 2-bit or 4-bit prefetch operation. However, for the 2-bit or 4-bit prefetch operation, the number of data lines which connect each bit line sense amplifying block to the I/O sense amplifying block is increased twice or four times; and, thus, the chip size of the semiconductor memory device is increased. In addition, if the number of data lines is rapidly increased, the data cannot be stably transmitted because of interference among a plurality of increased data lines.

On the other hand, as the semiconductor memory device is integrated more and more, i.e., the number of unit cells included in the semiconductor memory device is rapidly increased, the number of sense amplifiers included in each bit line sense amplifying block is increased.

Thus, for integrating many more sense amplifiers in each bit line sense amplifying block at a limited area, it is unavoidable that each sense amplifier is diminished, i.e., a driving capability of each sense amplifier becomes weak. As a result, the data stored in the cell block is more slowly transmitted to the I/O sense amplifying block. That is, the operation speed of the semiconductor memory device is dramatically decreased.

Therefore, for keeping the driving capability of each sense amplifier so that the data be stably transmitted from the bit line sense amplifying block to the I/O sense amplifying block and the operation speed of the semiconductor memory device is improved, a size of each bit line sense amplifying block should be increased, i.e., total size of the semiconductor memory device should be dramatically increased.

SUMMARY OF INVENTION

It is, therefore, an object of the present invention to provide a semiconductor memory device for improving a speed of data transmission inside the semiconductor memory device without any size increase of a bit line sense amplifying block.

In accordance with an aspect of the present invention, there is provided a semiconductor memory device having a high speed for a data transmission, including a plurality of cell blocks, each having a plurality of unit cells for storing data; a plurality of local bit line sense amplifying block, each for sensing and amplifying the data stored in the N number of cell blocks; a global bit line sense amplifying block for latching the data amplified by the local bit line sense amplifying blocks; and a data transferring block for transmitting the data from the local bit line sense amplifying block to the global bit line sense amplifying block.

BRIEF DESCRIPTION OF THE DRAWINGS

The above and other objects and features of the present invention will become apparent from the following description of preferred embodiments taken in conjunction with the accompanying drawings, in which.

DETAILED DESCRIPTION OF INVENTION

Hereinafter, a semiconductor memory device in accordance with the present invention will be described in detail referring to the accompanying drawings.

Figure 3:
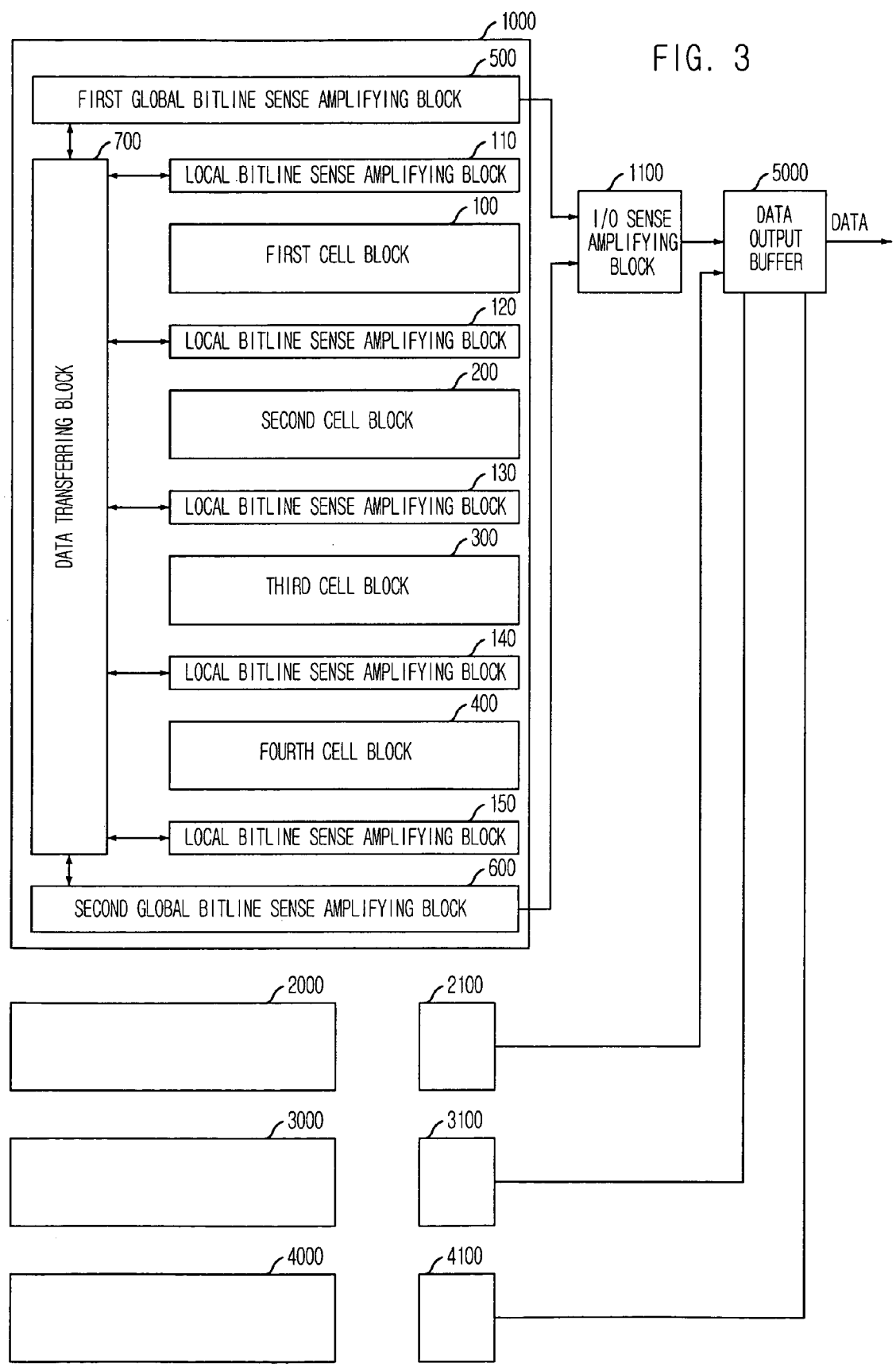
FIG. 3 is a block diagram showing a semiconductor memory device in accordance with the present invention.

FIG. 3 is a block diagram showing a semiconductor memory device in accordance with the present invention.

As shown, the semiconductor memory device includes a plurality of banks 1000 to 4000, a plurality of I/O sense amplifying block 1100 to 4100 and a data output buffer 5000.

Each bank, e.g., 1000, includes first to fourth cell blocks 100 to 400, first to fifth local bit line sense amplifying blocks 110 to 150, first and second global bit line sense amplifying blocks 500 and 600 and a data transferring block 700. Other banks are the same to the first bank 1000 in their structures.

Each cell block, e.g., 100, has a plurality of unit cells for storing data and is coupled to two neighboring local bit line sense amplifying blocks, e.g., 110 and 120. Each bit line sense amplifying block, e.g., 110, is for sensing data stored in the cell block and amplifying the sensed data to thereby output the amplified data to each I/O sense amplifying block, e.g., 1100. Herein, each bank, e.g., 1000, is coupled to each corresponding I/O sense amplifying block, e.g., 1100.

The data output buffer 5000 receives outputted data from the plurality of I/O sense amplifying block and outputs the buffered data to an external part.

Figure 1:
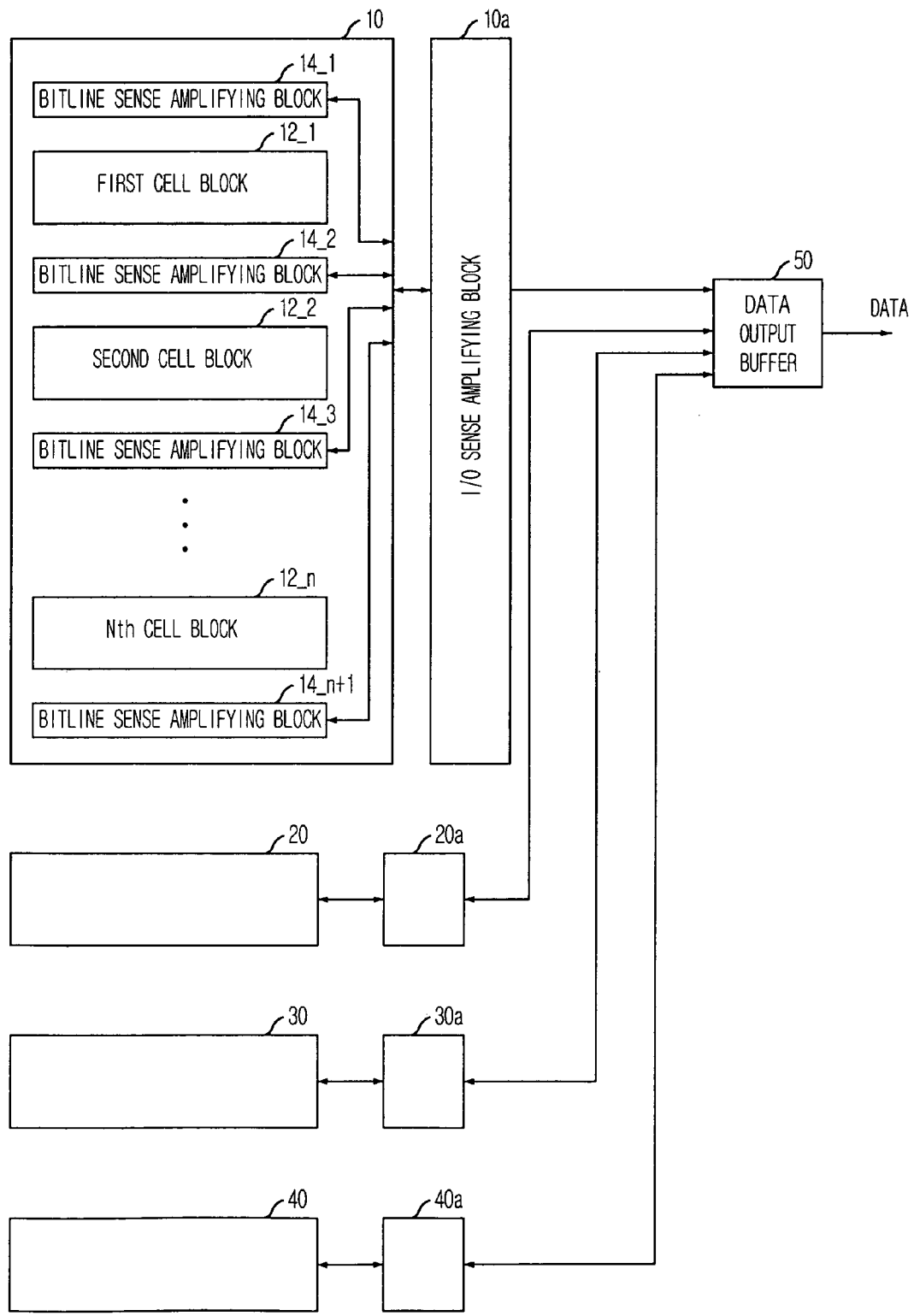
FIG. 1 is a block diagram showing a conventional semiconductor memory device.

Herein, for increasing an integration of chip, each cell block, e.g., 100, is coupled to two neighboring local bit line sense amplifying blocks, e.g., 110 and 120. Also, each local bit line sense amplifying block, e.g., 120, is coupled to two neighboring cell blocks, e.g., 100 and 200. As a result, if there are N number of banks in one bank, N+1 number of local bit line sense amplifying blocks are necessary. Herein, N is positive integer. Referring to FIG. 1, if the number of banks is 4, the number of local bit line sense amplifying blocks is 5.

Figure 2:
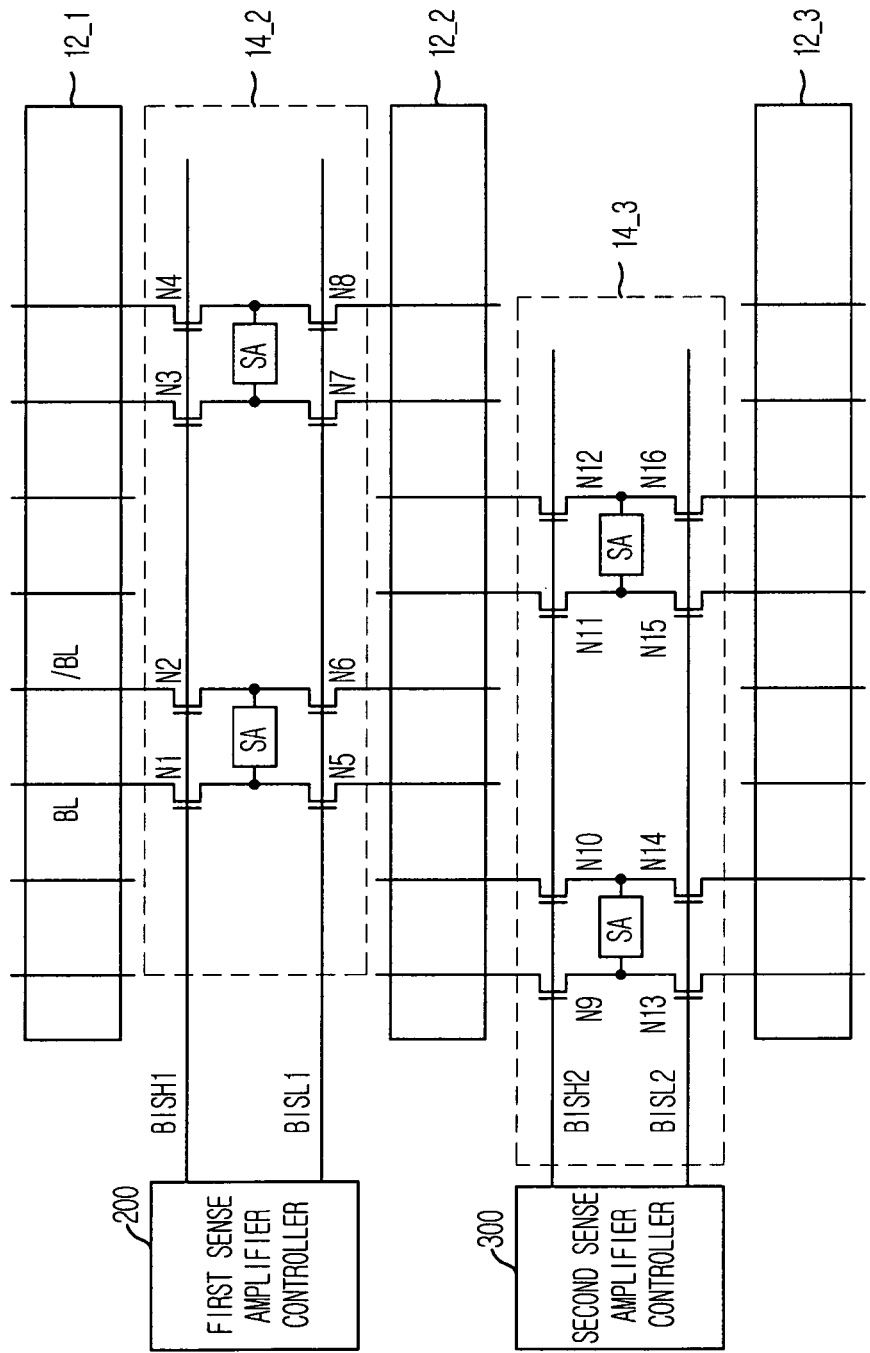
FIG. 2 is a block diagram describing a bank shown in FIG. 1.

In addition, the local bit line sense amplifying block is similar to the bit line sense amplifying block shown in FIG. 2. That is, when a word line in the first cell block 100 is activated, two neighboring local bit line sense amplifying blocks, i.e., 110 and 120, have to be coupled to the first cell block 100. For connecting or disconnecting each of first and second local bit line sense amplifying blocks 110 and 120 to the first cell blocks 100, each of first and second local bit line sense amplifying blocks 110 and 120 includes a local bit line switch controlled by control signals, e.g., BISH and BISL shown in FIG. 2.

Generally, if address and commend are inputted to the semiconductor memory device, the address and commend are decoded; and, then, a cell block is selected in response to the decoded address and commend. Also, in auto-refresh operation, one of cell blocks where a data access operation does not perform is selected. Thereafter, data stored in each cell block are outputted in response to one activated word line in the activated cell block. If the number of unit cells in response to one word line is 1024, two neighboring local bit line sense amplifying blocks respectively amplify a half of the data, i.e., 512 data because two local bit line sense amplifying blocks is coupled to one cell block. Namely, each bit line sense amplifying block has 512 sense amplifiers. Herein, an ordinary sense amplifier can be used as each sense amplifier included in the local bit line sense amplifying block.

The data transferring block 700 is for transmitting a data amplified by each local bit line sense amplifying block into each of first and second global bit line sense amplifying blocks. In detail, the data transferring block 700 includes a global bit line and a plurality of global bit line switches.

Figure 4:
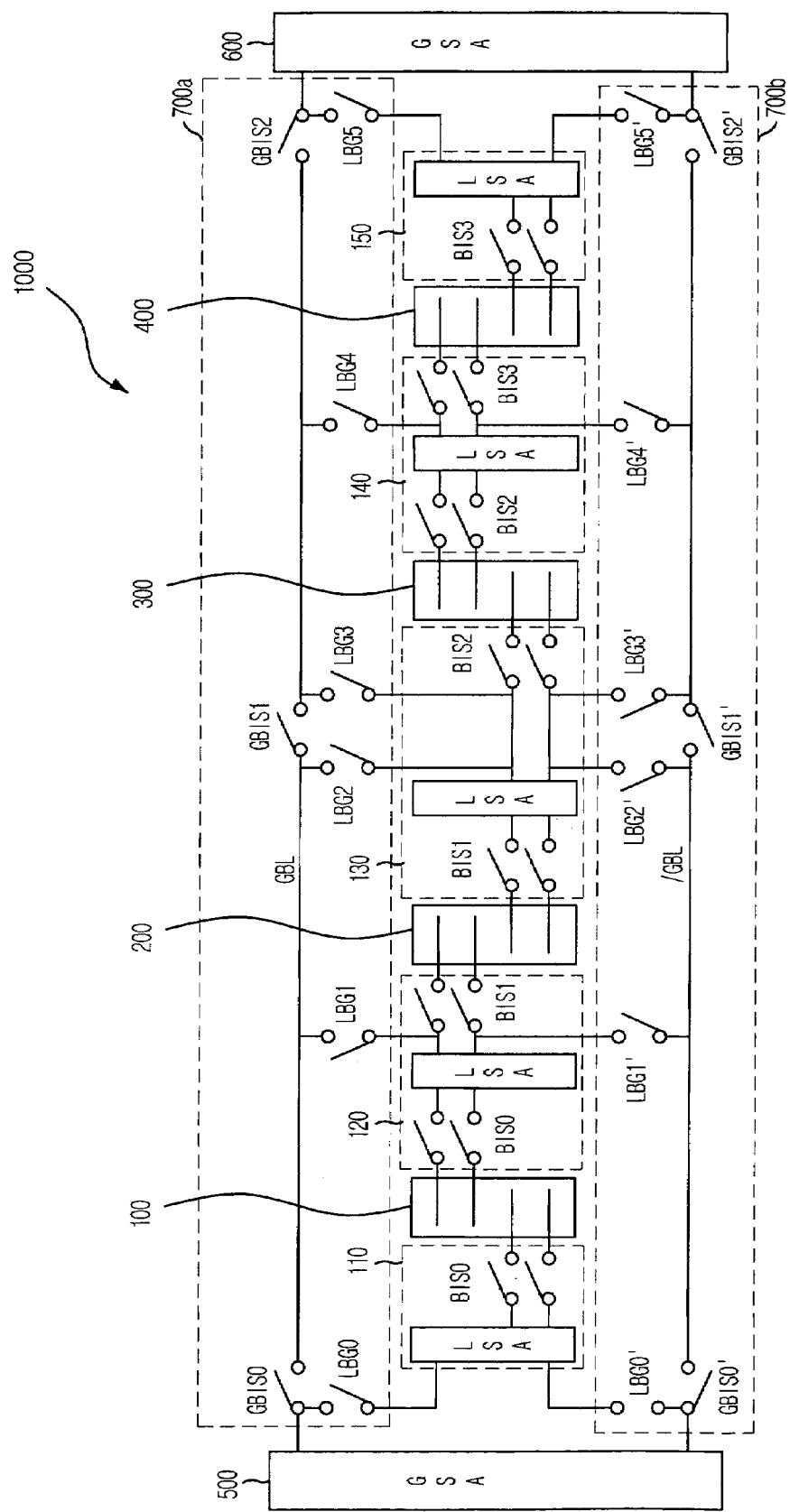
FIG. 4 is a block diagram describing a data transmission between a local bit line sense amplifier and a global bit line sense amplifier in a bank shown in FIG. 3.

FIG. 4 is a block diagram describing a data transmission between a local bit line sense amplifier and a global bit line sense amplifier in the first bank 1000 shown in FIG. 3. Particularly, the data transferring block 700 is described in detail.

As shown, each local bit line sense amplifier, e.g., 110, further has a local bit line switch, e.g., BIS0, controlled by control signals for transferring a data stored in the cell block, e.g., 100, to the local bit line sense amplifier.

Each bank has the data transferring block 700. In the data transferring block 700, there are first and second data global line block 700a and 700b. The first data global line block 700a includes a first global line GBL, first to sixth local to global switches LBG0 to LBG5 and first to third global bit line switches GBIS0 to GBIS2. Likewise, the second data global line block 700b includes a second global line /GBL, first to sixth local to global bar switches LBG0' to LBG5' and first to third global bit line bar switches GBIS0' to GBIS2'. Herein, the number of global lines can be increased according to the number of bit lines, the number of unit cells included in one cell block and an operation method of the semiconductor memory device.

Referring to FIG. 4, each of the first to fifth local bit line sense amplifying block 110 to 150 is connected or disconnected to the first and second global lines GBL and /GBL by the first to sixth local to global switches LBG0 to LBG5 and first to sixth local to global bar switches LBG0' to LBG5'. Each local bit line sense amplifying block, e.g., 110, is coupled to one local to global switch, e.g., LBG0, and one local to global bar switches, e.g., LBG0'. Namely, the local to global switches, e.g., LBG0, are for connecting or disconnecting the local bit line sense amplifying block to the global bit line sense amplifying block. The global line switches, e.g., GBIS0, determines which of the first and second global bit line sense amplifying blocks the amplified data by the local bit line sense amplifier is transmitted In the semiconductor memory device, data is sensed by using a voltage level difference between a pair of bit lines BL and /BL. Thus, in the data transferring block 700, the first and second global lines GBL and /GBL are respectively coupled to the bit line BL and the bit line bar /BL throughout each local to global switch, e.g., LBG0, and each local to global bar switch, e.g., LBG0'.

That is, data supplied to the bit line /BL is amplified by the local bit line sense amplifying block and, then, is inputted to the first or second global bit line sense amplifying block 500 or 600 throughout the first data transferring block 700a. Also, other data supplied to the bit line bar /BL is amplified by the local bit line sense amplifying block and, then, is inputted to the first or second global bit line sense amplifying block 500 or 600 throughout the second data transferring block 700b.

Yet, the third local bit line sense amplifying block 130 is coupled to the second and third local to global switches LBG2 and LBG3 and the second and third local to global bar switches LBG2' and LBG3'. In addition, in the data transferring block 700, the second global bit line switch GBIS1 is for connecting or disconnecting the first global line GBL between the third and fourth local to global switches LBG2 and LBG3. The second global bit line bar switch GBIS1' are for connecting or disconnecting the second global line /GBL between the third and fourth local to global bar switches LBG2' and LBG3'.

Namely, all switches, i.e., the local to global switches, the global line switches, the local to global bar switches and the global line bar switches, included in the first and second data transferring blocks 700a and 700b is properly turned on or off in response to the selected cell block. As a result, a data collision is prevented.

Hereinafter, referring to FIGS. 5 and 6, how to prevent the data collision by controlling the switches in the first and second data transferring blocks 700a and 700b is described in detail.

Figure 5:
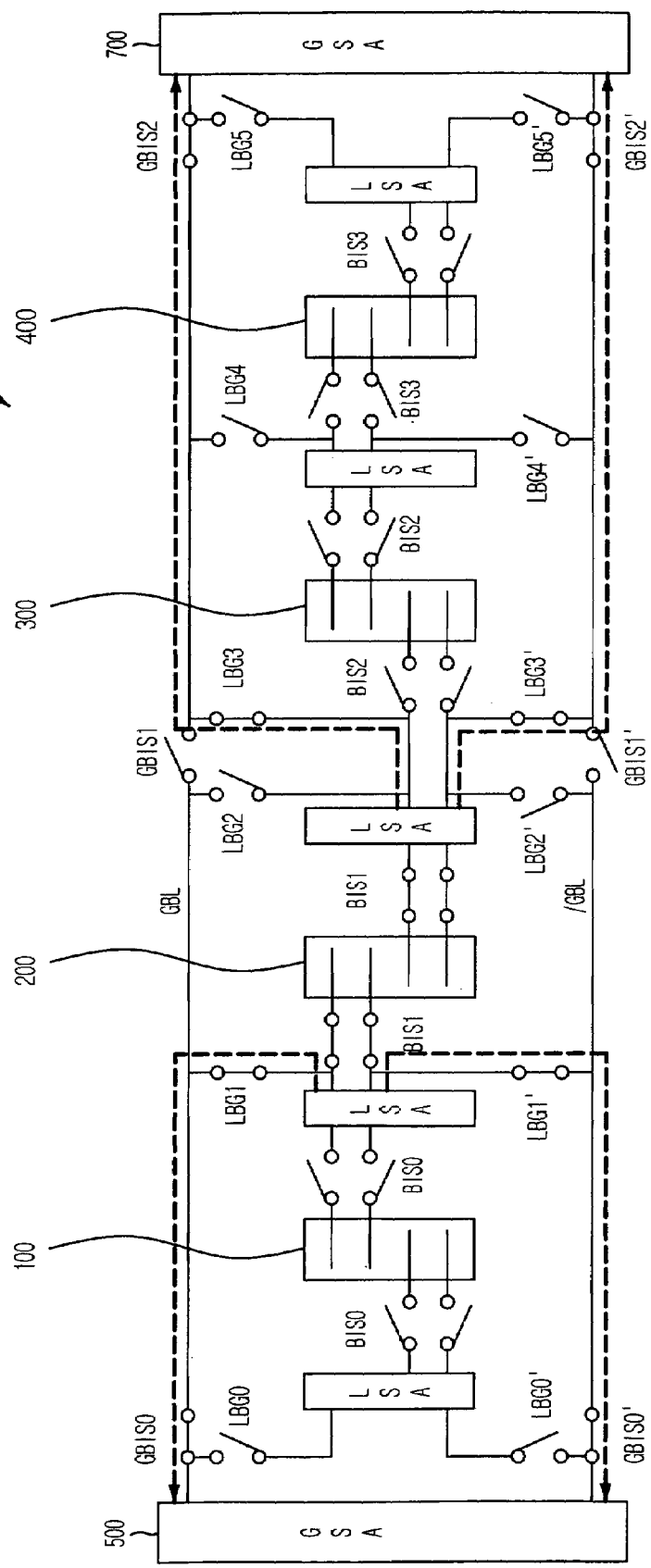
FIG. 5 is a block diagram describing a data transmission between a local bit line sense amplifier and a global bit line sense amplifier when data stored in a second cell block shown in FIG. 4 is accessed.

FIG. 5 is a block diagram describing a data transmission between the local bit line sense amplifier LSA and the global bit line sense amplifier GSA when data stored in the second cell block 200 shown in FIG. 4 is accessed.

When the second cell block 200 is selected, one data are amplified by the second local bit line sense amplifying block 120 and the other data are amplified by the third local bit line sense amplifying block 130. Then, in the first data global line block 700a, the one data is transferred throughout the second local to global switch LBS1 and the first global bit line switch GBIS0; and the other data is transferred throughout the fourth local to global switch LBS3 and the third global bit line switch GBIS2. At this time, for preventing the data collision, the third local to global switch LBS2 and the second global bit line switch GBIS1 are opened.

Simultaneously, in the second data global line block 700b, the second and fourth local to global bar switches LBS1' and LBS3' and the first and third global bit line switches GBIS0' and GBIS2' are closed; and, for preventing the data collision, the third local to global bar switch LBS2' and the second global bit line bar switch GBIS1' are opened.

Figure 6:
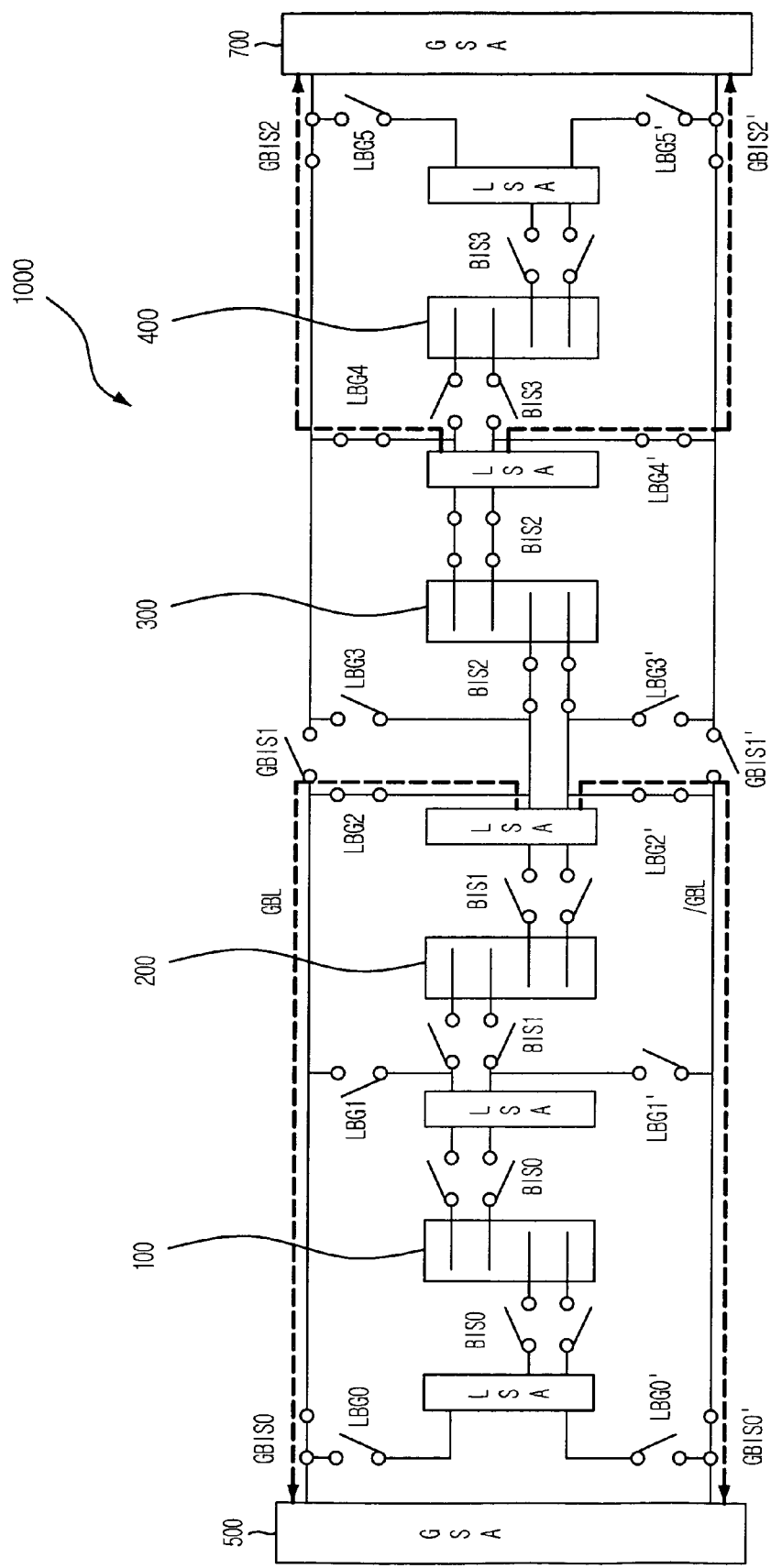
FIG. 6 is a block diagram describing a data transmission between a local bit line sense amplifier and a global bit line sense amplifier when data stored in a third cell block shown in FIG. 4 is accessed.

FIG. 6 is a block diagram describing a data transmission between the local bit line sense amplifier LSA and the global bit line sense amplifier GSA when data stored in the third cell block 300 shown in FIG. 4 is accessed.

When the third cell block 300 is selected, one data are amplified by the third local bit line sense amplifying block 130 and the other data are amplified by the fourth local bit line sense amplifying block 140. Then, in the first data global line block 700a, the one data is transferred throughout the third local to global switch LBS2 and the first global bit line switch GBIS0; and the other data is transferred throughout the fifth local to global switch LBS4 and the third global bit line switch GBIS2. At this time, for preventing the data collision, the fourth local to global switch LBS3 and the second global bit line switch GBIS1 are opened.

Simultaneously, in the second data global line block 700*b*, the third and fifth local to global bar switches LBS2' and LBS4' and the first and third global bit line switches GBIS0' and GBIS2' are closed; and, for preventing the data collision, the fourth local to global bar switch LBS3' and the second global bit line bar switch GBIS1' are opened.

Figure 7:
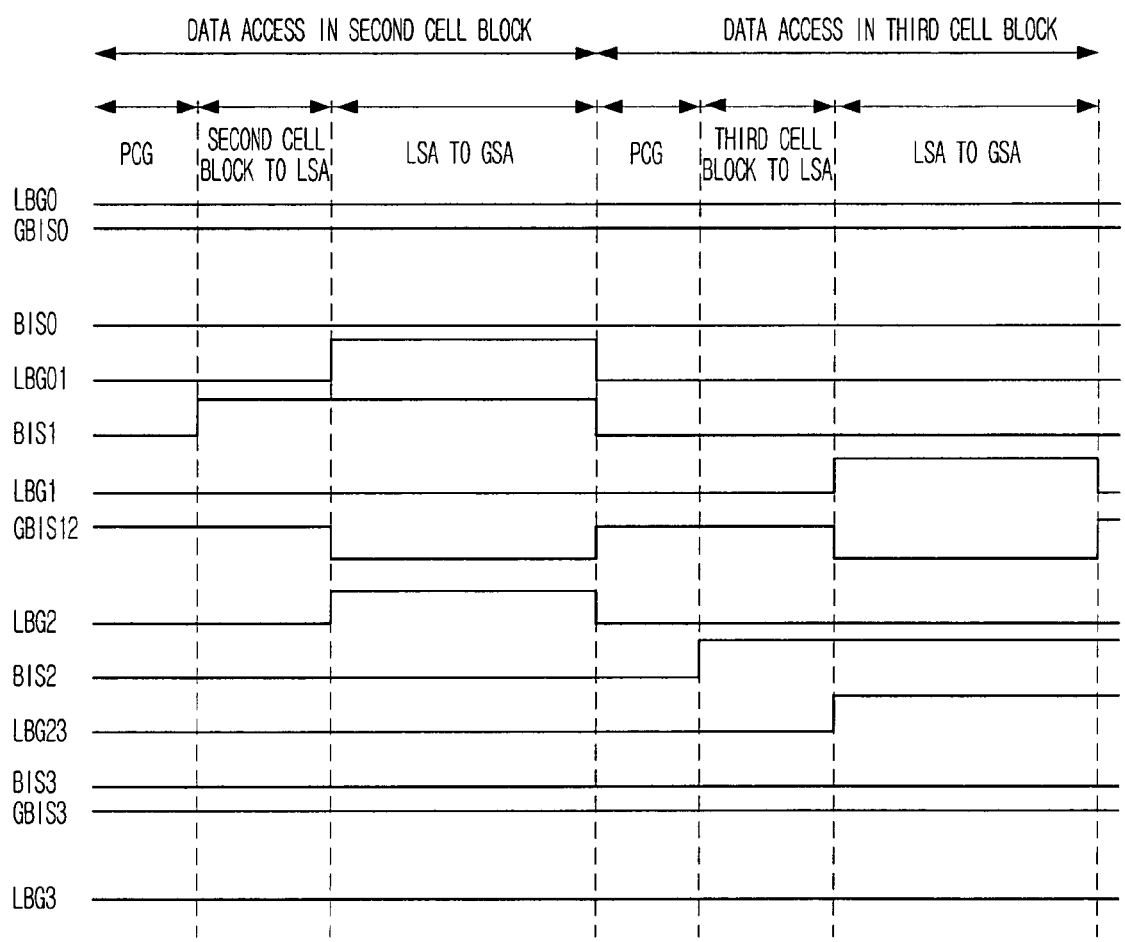
FIG. 7 is a waveform demonstrating an operation of the semiconductor memory device shown in FIG. 3.

FIG. 7 is a waveform demonstrating an operation of the semiconductor memory device shown in FIG. 3.

As shown, there is described which switch is activated when the data access operation is performed in the second cell block 200 and the third cell block 300.

First, in duration of carrying out the data access operation in the second cell block 200, there are three steps. In a first period PCG, the bit lines are precharged. Then, in a second period, a local bit line switch, i.e., BIS1, is turned on for transferring data stored in the second cell block 200 to the second and third local bit line sense amplifying block (LSA) 120 and 130. Lastly, in a third period, the first and fourth local to global switches LBG1 and LBG3 and the first and third global bit line switches GBIS0 and GBIS3 are turned on for transmitting the data amplified by the second and third local bit line sense amplifying block 120 and 130 to the first and second global bit line sense amplifying block 500 and 600. Though there are not shown, the first and fourth local to global bar switches LBG1' and LBG3' and the first and third global bit line bar switches GBIS0' and GBIS3' are also turned on in the second global bit line block 700*b*.

Likewise, when the data access operation is performed in the third cell block 300, a local bit line switch, i.e., BIS2, is turned on for transferring data stored in the third cell block 200 to the third and fourth local bit line sense amplifying block (LSA) 130 and 140 in a second period after a precharge operation. In a third period, the third and fifth local to global switches LBG2 and LBG4 and the first and third global bit line switches GBIS0 and GBIS3 are turned on for transmitting the data amplified by the third and fourth local bit line sense amplifying block 120 and 140 to the first and second global bit line sense amplifying block 500 and 600. Though there are not shown, the third and fifth local to global bar switches LBG2' and LBG4' and the first and third global bit line bar switches GBIS0' and GBIS3' are also turned on in the second global bit line block 700*b*.

As above described, the semiconductor memory device in accordance with the present invention includes a global bit line sense amplifying block between a local bit line sense amplifying block and an I/O sense amplifying block. Furthermore, the semiconductor memory device in accordance with the present invention includes a data transferring block between the local bit line sense amplifying block and the global bit line sense amplifying block. Therefore, the present invention can improve a speed for a data transmission in the semiconductor memory device.

In the prior art, for improving the speed for the data transmission, a driving capability of each sense amplifier included in the local bit line sense amplifying block should be increased. However, in the present invention, though the sense amplifier included in the local bit line sense amplifying block does not have great driving capability, the speed for the data transmission can be improved because of the global bit line sense amplifying block.

Thus, without dramatically increasing a circuit size, the semiconductor memory device can improve the speed of the data transmission. In addition, data lines which is for transmitting data from the local bit line sense amplifying block to the I/O sense amplifying block is more simplified; and, then, an area occupied by the data lines is reduced.

In conclusion, the present invention can dramatically improve the speed of the data transmission by adding the global bit line sense amplifying block and the data transferring block to the conventional semiconductor memory device.

The present application contains subject matter related to Korean patent application No. 2003-98456, filed in the Korean Patent Office on Dec. 29, 2003, the entire contents of which being incorporated herein by reference.

While the present invention has been described with respect to the particular embodiments, it will be apparent to those skilled in the art that various changes and modifications may be made without departing from the spirit and scope of the invention as defined in the following claims.

What is claimed is:

1. A semiconductor memory device having a high speed for a data transmission, comprising:
    a plurality of cell blocks, each having a plurality of unit cells for storing data;
    a plurality of local bit line sense amplifying blocks, each for sensing and amplifying the data stored in the plurality of cell blocks;
    a first global bit line sense amplifying block for latching one data amplified by the local bit line sense amplifying blocks;
    a second global bit line sense amplifying block for latching the other data amplified by the local bit line sense amplifying blocks; and
    a data transferring block for selectively transmitting the data from the local bit line sense amplifying block to corresponding one of the first and the second global bit line sense amplifying blocks.

2. The semiconductor memory device as recited in claim 1, wherein each cell block is coupled to two neighboring local bit line sense amplifying blocks.

3. The semiconductor memory device as recited in claim 2, wherein the local bit line sense amplifying block receives data outputted from two neighboring cell blocks.

4. The semiconductor memory device as recited in claim 3, wherein the number of local bit line sense amplifying blocks is N+1 if the number of cell block is N, N being a positive integer.

5. The semiconductor memory device as recited in claim 4, wherein one data are inputted to one of the two neighboring local bit line sense amplifying block and the other data are inputted to the other of the two neighboring local bit line sense amplifying block when a data access operation is performed in one cell block.

6. The semiconductor memory device having as recited in claim 5, wherein the data transferring block includes:
    a first data transferring block for transmitting a first voltage level outputted from the local bit line sense amplifying block to the first global bit line sense amplifying block; and
    a second data transferring block for transmitting a second voltage level outputted from the local bit line sense amplifying block to the second global bit line sense amplifying block,
    wherein the data is determined based on a voltage level difference between the first and second voltage levels.

* * * * *

UNITED STATES PATENT AND TRADEMARK OFFICE
CERTIFICATE OF CORRECTION

| | | |
|---|---|---|
| PATENT NO. | : 7,088,637 B2 | Page 1 of 1 |
| APPLICATION NO. | : 10/876380 | |
| DATED | : August 8, 2006 | |
| INVENTOR(S) | : Ko et al. | |

It is certified that error appears in the above-identified patent and that said Letters Patent is hereby corrected as shown below:

In claim #6, line #1, please delete "having".

Signed and Sealed this

Seventh Day of August, 2007

JON W. DUDAS
*Director of the United States Patent and Trademark Office*